United States Patent [19]

Hatchett et al.

[11] 4,361,769

[45] Nov. 30, 1982

[54] METHOD FOR PERFORMING A SAMPLE AND HOLD FUNCTION

[75] Inventors: John D. Hatchett, Scottsdale, Ariz.; Andrew S. Olesin, Austin, Tex.

[73] Assignee: Motorola, Inc., Schaumburg, Ill.

[21] Appl. No.: 164,971

[22] Filed: Jul. 1, 1980

[51] Int. Cl.³ .............................................. G11C 27/02
[52] U.S. Cl. .................................... 307/353; 307/228; 307/510; 328/151
[58] Field of Search ............... 307/352, 353, 510, 511, 307/525, 526, 228; 328/151

[56] References Cited

U.S. PATENT DOCUMENTS

| | | | |
|---|---|---|---|
| 3,586,880 | 6/1971 | Fitzwater, Jr. ..................... | 307/353 |
| 4,121,273 | 10/1978 | Jarrett et al. ........................ | 361/239 |
| 4,151,473 | 4/1979 | Coleman et al. .................... | 307/353 |
| 4,166,248 | 8/1979 | Bianchi et al. ...................... | 307/353 |

Primary Examiner—John Zazworsky
Attorney, Agent, or Firm—Joe E. Barbee

[57] ABSTRACT

A method of using a sample and hold circuit to obtain a substantially ripple free voltage on the holding capacitor is provided by holding the charge capacitor at a constant voltage during the sampling time and by not routinely charging the charge capacitor to the maximum potential available. This provides a virtually constant voltage from which the holding capacitor can be charged. The level to which the charging capacitor is charged is controlled by an error signal. This error signal is reflected onto the holding capacitor, and is used as an output for the sample and hold circuit.

7 Claims, 4 Drawing Figures

METHOD FOR PERFORMING A SAMPLE AND HOLD FUNCTION

This invention relates, in general, to sample and hold circuits, and more particularly, to a method for performing a sample and hold function.

Sample and hold circuits are used in many different types of electronic systems. Typically a sample and hold circuit will have a charging capacitor and a holding capacitor. A charging capacitor is normally allowed to charge at a predetermined rate. The holding capacitor is charged at predetermined intervals from the charging capacitor. One of the problems with this type of a sample and hold circuit is that the holding capacitor is charged from the charging capacitor while the charging capacitor is still being charged. This means that the holding capacitor is charged from a source (the charging capacitor) which is changing in value and results in an undesired ripple voltage on the holding capacitor.

Accordingly, it is an object of the present invention to provide a method of operating a sample and hold circuit which eliminates an undesired ripple voltage on the holding capacitor.

Yet another object of the present invention is to provide a method of operating a sample and hold circuit having one charging capacitor and one holding capacitor wherein the charging capacitor is not charged to the maximum available potential and results in a substantially ripple free voltage on the holding capacitor.

SUMMARY OF THE INVENTION

In carrying out the above and other objects of the present invention, there is provided in one form an improved method of operating a sample and hold circuit. A first capacitor is charged to a predetermined level which is generally less than the maximum available charge. The charge is held on the first capacitor until a second capacitor can be charged from the first capacitor. The second capacitor is disconnected from the first capacitor and the procedure is repeated by charging the first capacitor to the predetermined level again.

DETAILED DESCRIPTION OF THE DRAWINGS

Figure 1:
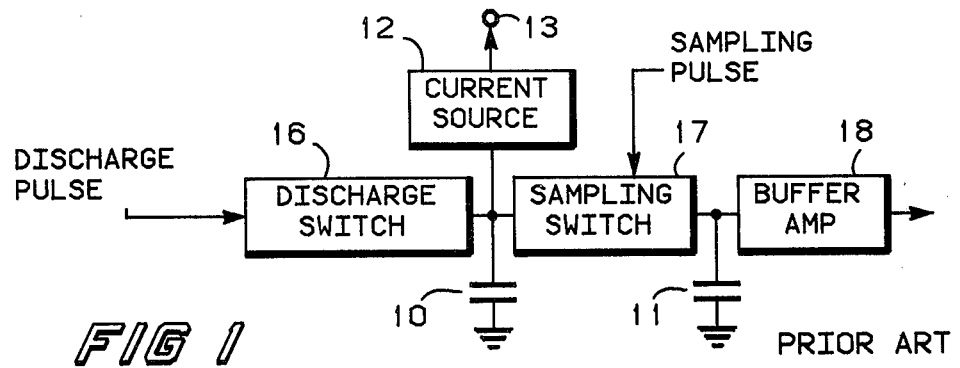
FIG. 1 shows a prior art sample and hold circuit.

FIG. 1 illustrates, in block diagram form, a typical sample and hold circuit. The sample and hold circuit illustrated has been used in the past as a sample and hold phase detector/comparator in a phase locked loop (PLL) frequency synthesizer; however as will be explained hereinafter, this circuit suffers from certain limitations. A charging current source 12 is coupled to a charging capacitor 10. Current source 12 receives power from a power supply terminal 13. Capacitor 10 is charged to the maximum potential available from power supply 13. While capacitor 10 is charging, sampling switch 17 couples capacitor 10 to a holding capacitor 11. The magnitude of the charge on capacitor 11 is coupled by a buffer-amplifier 18 to provide an output for the sample and hold circuit. A discharge switch 16 can controllably discharge capacitor 10.

Figure 2:
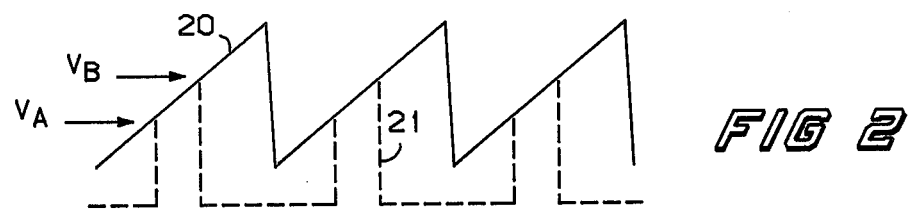
FIG. 2 shows a waveform illustrating the charging and sampling of the sample and hold circuit of FIG. 1.

To understand the operation of the sample and hold circuit of FIG. 1 reference must be made to FIG. 2. A sawtooth ramp voltage 20 is established on capacitor 10 by charging and discharging capacitor 10 with current source 12 and discharge switch 16 respectfully. A sampling pulse closes sampling switch 17 for a short period of time during each period of sawtooth ramp 20. The short period of time is illustrated by dotted lines 21. During one or more repetitions of this short period of time, capacitor 11 is charged to the ramp voltage present during the sampling time. Except for leakage, the charge (voltage) established on capacitor 11 during the sampling time will remain until the next sample. The sampling pulse in a phase locked loop frequency synthesizer can be derived from the loop voltage controlled oscillator (VCO) signal. Should the loop VCO attempt to drift, the sampling pulse relative to the ramp shifts so as to move the sampling window 21 up or down on the ramp by an appropriate amount to establish a new hold voltage on capacitor 11 to pull the voltage controlled oscillator back into the desired locked state. The charge or voltage established on capacitor 11 is coupled by a buffer amplifier 18 to provide an error voltage to a loop filter which provides the correction signal to the voltage controlled oscillator.

The customary implementation for the sample and hold circuit described above results in an undesired ripple voltage on capacitor 11. This is caused by the ramp charging from level $V_A$ to level $V_B$ during the sampling time. Capacitor 11 is therefore being charged to $V_B$ and discharged to $V_A$ and this prevents establishing a ripple-free "locked" voltage. The magnitude of this ripple will be a function of the ramp charging slope, sampling time, and the charge/discharge time of capacitor 11. One approach to solving this problem has been to add an additional sampling switch and hold capacitor (such as switch 17 and capacitor 11) along with the necessary control signals. However, this additional circuitry introduces more switching transients and undesirable signal cross coupling and consumes area on a monolithic integrated circuit chip.

Figure 3:
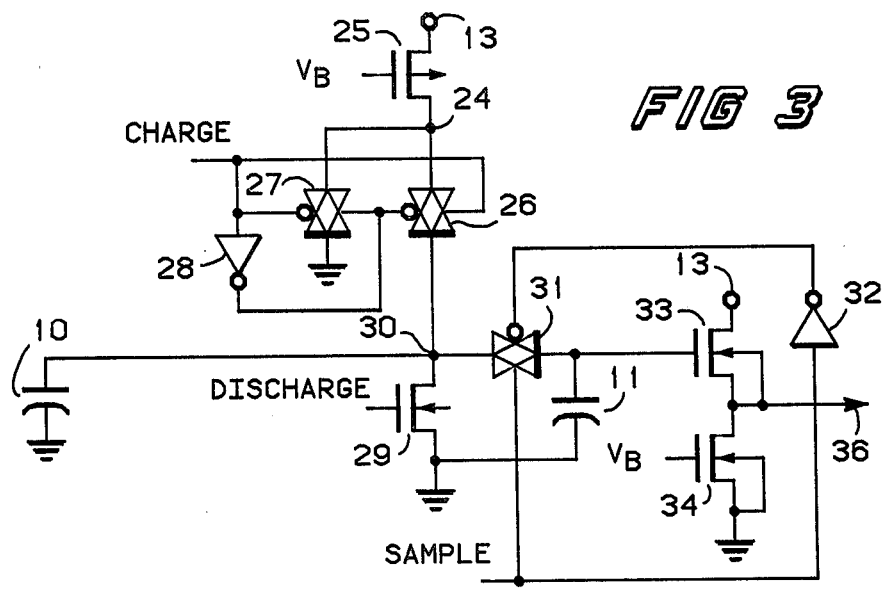
FIG. 3 illustrates a sample and hold circuit useful in practicing the present invention.

FIG. 3 illustrates in schematic form a sample and hold circuit. Charging capacitor 10 and holding capacitor 11 serve the same functions in the circuit of FIG. 3 as they did for the circuit of FIG. 1. Transistor 25 serves as a current source and is coupled from voltage power supply terminal 13 to a node 24. Transistor 25 has a bias voltage applied to its gate electrode. Transistor 25 is illustrated as being a P-channel field effect transistor. A transmission gate 26 couples node 24 to node 30. Capacitor 10 is coupled from node 30 to a reference terminal illustrated as ground. Node 24 is also coupled to ground by a transmission gate 27. Transmission gates 26 and 27 are controlled by a charge signal which is connected directly to one side of the transmission gates and coupled through an inverter 28 to the other side of the transmission gates. A transistor 29, illustrated as an N-channel field effect transistor, is coupled in parallel with capacitor 10 from node 30 to ground. Transistor 29 is controlled by a discharge signal and when enabled will discharge capacitor 10. Node 30 is also coupled to capacitor 11 by transmission gate 31. A sample signal which controls transmission gate 31 is connected directly to transmission gate 31 on one side and coupled through an inverter 32 to the other side of transmission gate 31. Capacitor 11 is also connected to a gate electrode of transistor 33. Transistor 34 is connected in series with transistor 33 between power supply terminal 13 and ground. Transistor 34 has a bias voltage, $V_B$, applied to its gate electrode to provide a desired reference level at output terminal 36. This bias voltage, $V_B$, may be of a different value than the bias voltage, $V_B$, applied to the gate electrode of transistor 25. Transistors 33 and 34 are illustrated as being N-channel field effect transistors. All the components illustrated in FIG. 3 are intended to be integrated on a single monolithic integrated circuit, except for capacitor 10 which is much larger than capacitor 11.

Figure 4:
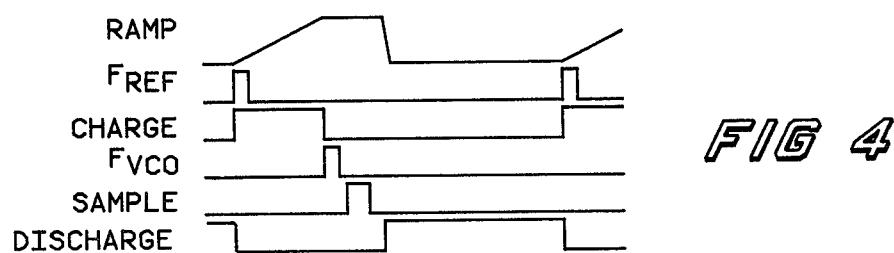
FIG. 4 shows some timing waveforms useful in understanding the operation of the sample and hold circuit of FIG. 3.

A method of operation for the sample and hold circuit of FIG. 3 will now be explained with reference to the waveforms shown in FIG. 4. The top waveform illustrates the ramp voltage impressed on capacitor 10 and which is present at node 30. The second waveform, $F_{REF}$, has a pulse which represents a reference input signal to the detector of a PLL system. $F_{REF}$ initiates a charge signal illustrated in the third waveform. This charge signal is used to control transmission gates 26 and 27. The leading edge of the charge pulse will cause transmission gate 27 to open up and transmission gate 26 to close. When transmission gate 26 closes the voltage appearing at node 30 will increase as illustrated in the ramp signal. At the end of the charge pulse, transmission gate 26 opens and transmission gate 27 closes. The fourth signal, $F_{VCO}$, is representative of the voltage control oscillator frequency and serves to terminate the charge signal. Termination of the charge signal causes the ramp voltage appearing on capacitor 10 to cease increasing thereby establishing a constant voltage on capacitor 10 as illustrated by the flat portion of the top of the ramp signal shown in the first waveform. A sample signal, Sample, then enables transmission gate 31 thereby effectively placing capacitors 10 and 11 in parallel so that capacitor 11 can be charged from capacitor 10. Capacitor 11 is allowed to charge for a short period of time the same as was done for the circuit of FIG. 1. In a preferred embodiment, the sample signal is delayed slightly to ensure that any switching transients caused by the other signals will have subsided by the time sampling occurs. A predetermined time after the sample signal occurs then a discharge signal enables transistor 29 which serves to discharge capacitor 10. Capacitor 11 is not discharged since by this time transmission gate 31 is already open. The voltage appearing on capacitor 11 is transferred by transistors 33 and 34 to output terminal 36 which represents an analog phase detector output if we still assume that the sample and hold circuit is used in a phase locked loop frequency synthesizer.

Transmission gate 27 is enabled at the same time that transmission gate 26 is disabled thereby allowing all the current from transistor 25 to be shunted to ground. By having the output of transistor 25 shunted from node 30 to ground permits the transistor to always remain in a conductive state thereby avoiding start-up glitches.

By now it should be appreciated that there has been provided a new and improved method for operating a sample and hold circuit which results in obtaining a ripple free voltage on the hold capacitor. The charging capacitor is not, as a matter of practice, allowed to charge to the maximum available potential but can charge to the maximum available potential if the system of which the sample and hold circuit is a part requires a large correction signal. Also once the charge on the charging capacitor is established it is not modified by the current source during the sampling time.

We claim:

1. A method of operating a sample and hold circuit, comprising: switching a current source to a first capacitor and charging the first capacitor to a predetermined level; leaving the current source in a conductive state and disconnecting the current source from the first capacitor once the predetermined level is reached; connecting a second capacitor to the first capacitor so that the second capacitor can be charged from the first capacitor; disconnecting the second capacitor from the first capacitor; and recharging the first capacitor to the predetermined level.

2. The method of claim 1 wherein the first capacitor is larger than the second capacitor.

3. The method of claim 1 further including switching the current source to a current sink when disconnecting the current source from the first capacitor.

4. A method of operating a sample and hold circuit, comprising: charging a first capacitor by switching a current source output to the first capacitor; inhibiting further charge of the first capacitor and simultaneously leaving the current source in a conductive state; charging a second capacitor from the first capacitor; providing an output for the sample and hold circuit from the charge on the second capacitor; and discharging the first capacitor to a known reference.

5. The method of claim 4 wherein the first capacitor is charged to less than the available charge from the current source.

6. The method of claim 5 wherein the first capacitor is larger than the second capacitor.

7. A method of reducing switching transient effects on a sample and hold circuit, comprising: charging a first capacitor by switching a current source output to the first capacitor; terminating the charging of the first capacitor and leaving the current source in a conductive state; after a predetermined delay sampling the charge on the first capacitor by coupling the first capacitor to a second capacitor; disconnecting the first capacitor from the second capacitor; discharging the first capacitor; and repeating the above steps.

* * * * *